United States Patent
Pinneo et al.

(10) Patent No.: US 6,700,913 B2
(45) Date of Patent: Mar. 2, 2004

(54) LOW COST HIGH INTEGRITY DIODE LASER ARRAY

(75) Inventors: George G. Pinneo, Manhattan Beach, CA (US); Marijan D. Grgas, Rancho Palos Verdes, CA (US); Kriss A. Bennett, Long Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 37 days.

(21) Appl. No.: 09/867,042

(22) Filed: May 29, 2001

(65) Prior Publication Data

US 2002/0181523 A1 Dec. 5, 2002

(51) Int. Cl.⁷ .................................. H01S 5/00
(52) U.S. Cl. .............. 372/43; 372/50; 372/66; 372/75; 372/88; 372/36
(58) Field of Search ............. 372/43, 50, 66, 372/75, 36, 88

(56) References Cited

U.S. PATENT DOCUMENTS

| | | | |
|---|---|---|---|
| 3,590,248 A | 6/1971 | Chatterton, Jr. et al. | |
| 3,771,031 A | 11/1973 | Kay et al. | |
| 3,962,655 A | 6/1976 | Selway et al. | |
| 4,092,614 A | 5/1978 | Sakuma et al. | |
| 4,315,225 A | 2/1982 | Allen, Jr. et al. | |
| 4,383,270 A | 5/1983 | Schelhorn et al. | |
| 4,393,393 A | 7/1983 | Allen, Jr. et al. | |
| 4,454,602 A | 6/1984 | Smith et al. | |
| 4,573,067 A | 2/1986 | Tuckerman et al. | |
| 4,617,585 A | 10/1986 | Yasui et al. | |
| 4,716,568 A | 12/1987 | Scifres et al. | |
| 4,791,634 A | * 12/1988 | Miyake | 372/34 |
| 4,831,629 A | 5/1989 | Paoli et al. | |
| 4,847,848 A | 7/1989 | Inoue et al. | |
| 4,877,641 A | 10/1989 | Dory et al. | |
| 4,881,237 A | 11/1989 | Donnelly et al. | |
| 4,899,204 A | 2/1990 | Rosen et al. | |
| 4,901,330 A | 2/1990 | Wolfram et al. | |
| 4,975,923 A | 12/1990 | Buus et al. | |
| 5,022,042 A | 6/1991 | Bradley et al. | |
| 5,031,187 A | 7/1991 | Orenstein et al. | |
| 5,040,187 A | 8/1991 | Karpinski | |
| 5,073,838 A | 12/1991 | Ames et al. | |
| 5,099,488 A | 3/1992 | Ahrabi et al. | |
| 5,105,429 A | 4/1992 | Mundinger et al. | |
| 5,128,951 A | 7/1992 | Karpinski et al. | |
| 5,156,999 A | 10/1992 | Lee et al. | |
| 5,163,064 A | 11/1992 | Kim et al. | |

(List continued on next page.)

FOREIGN PATENT DOCUMENTS

| | | |
|---|---|---|
| EP | 0458469 | 11/1991 |
| EP | 0550996 | 7/1993 |
| EP | 0634822 | 1/1995 |

*Primary Examiner*—Allan R. Wilson
*Assistant Examiner*—Matthew E. Warren
(74) *Attorney, Agent, or Firm*—Katten Muchin Zavis Rosenman; John S. Paniaguas

(57) ABSTRACT

A semiconductor laser diode array including a plurality of laser diode bars, each carried by a submount and forming a subassembly. Each subassembly is separated by a flexible or compliant electrically conductive spacer. All connections within the array are by way of a non-fluxed solder, that may be hard and/or soft, reflowed in a non-oxidizing atmosphere in a simple mechanical stack fixture to create nearly void-free solder joints with relatively high thermal integrity and electrical conductivity. Flexible electrically conductive spacers are disposed between the subassemblies to eliminate tensile stress on the laser diode bars while providing electrical conductivity between subassemblies. The subassemblies are carried by a thermally conductive dielectric substrate, allowing waste heat generated from the bars to be conducted to a cooling device. The invention eliminates known failure modes in interconnections, minimizing tensile strength on the diode arrays, and increasing the useful life of the array.

19 Claims, 6 Drawing Sheets

U.S. PATENT DOCUMENTS

| | | | |
|---|---|---|---|
| 5,212,699 A | 5/1993 | Masuko et al. | |
| 5,216,263 A | 6/1993 | Paoli et al. | |
| 5,216,688 A | 6/1993 | Kortz et al. | |
| 5,284,790 A | 2/1994 | Karpinski et al. | |
| 5,287,375 A | 2/1994 | Fujimoto et al. | |
| 5,305,304 A | 4/1994 | Hayashi | |
| 5,305,344 A | 4/1994 | Patel et al. | |
| 5,311,535 A | 5/1994 | Karpinski et al. | |
| 5,311,536 A | 5/1994 | Paoli et al. | |
| 5,323,411 A | 6/1994 | Shirasaka et al. | |
| 5,325,384 A * | 6/1994 | Herb et al. | 372/36 |
| 5,337,325 A | 8/1994 | Hwang et al. | |
| 5,351,259 A | 9/1994 | Ishimori et al. | |
| 5,394,426 A | 2/1995 | Joslin | |
| 5,394,427 A | 2/1995 | McMinn et al. | |
| 5,402,436 A | 3/1995 | Paoli et al. | |
| 5,402,437 A | 3/1995 | Mooradian et al. | |
| 5,438,580 A | 8/1995 | Patel et al. | |
| 5,526,373 A | 6/1996 | Karpinski et al. | |
| 5,555,254 A | 9/1996 | Injeyan et al. | |
| 5,646,773 A | 7/1997 | Injeyan et al. | |
| 5,663,979 A | 9/1997 | Marshall et al. | |
| 5,748,654 A | 5/1998 | Marabella et al. | |
| 5,764,675 A | 6/1998 | Juhala et al. | |
| 5,835,518 A | 11/1998 | Mundinger et al. | |
| 5,913,108 A | 6/1999 | Stephens et al. | |
| 5,923,692 A * | 7/1999 | Staskus et al. | 372/50 |
| 6,094,297 A | 7/2000 | Injeyan et al. | |
| 6,178,040 B1 | 1/2001 | Injeyan et al. | |
| 6,208,677 B1 * | 3/2001 | Moyer | 372/66 |
| 6,295,307 B1 * | 9/2001 | Hoden et al. | 372/36 |

\* cited by examiner

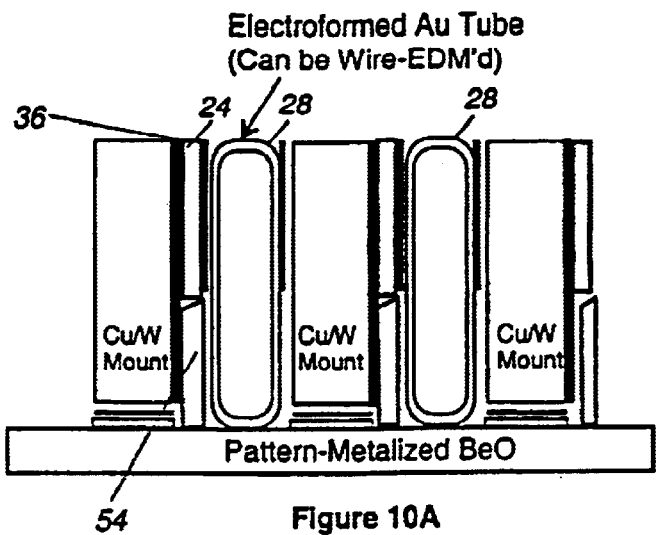
Figure 10A
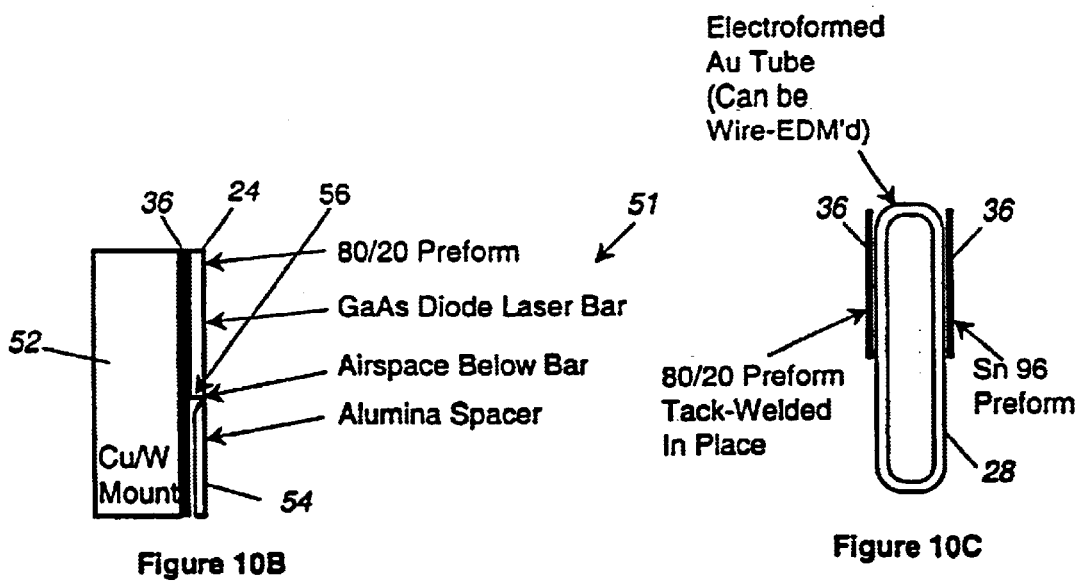
Figure 10B
Figure 10C

LOW COST HIGH INTEGRITY DIODE LASER ARRAY

BACKGROUND OF THE INVENTION

1. Field of the Invention

The present invention relates to a semiconductor laser diode array and more particularly to a semiconductor laser diode array which includes a plurality of semiconductor laser diodes separated by electrically conductive flexible or compliant spacers which minimizes tensile stress on the semiconductor laser diodes and in which connections are electrically connected by way of non-fluxed solders, hard and/or soft, such as eutectic solder, to eliminate various failure modes of known semiconductor diode laser arrays.

2. Description of the Prior Art

Semiconductor diode laser arrays are known in the art. Such semiconductor laser diode arrays are used in various applications including optical pumping of Nd: YAG slabs of lasing material used to form, for example, zig-zag optical amplifiers. Examples of such optical amplifiers are disclosed in commonly-owned U.S. Pat. Nos. 5,555,254; 5,646,773; 6,094,297 and 6,178,040. Such semiconductor diode laser arrays are used to optically excite the slabs to a relatively high-energy metastable state.

Such semiconductor diode laser arrays normally include a plurality of individual semiconductor laser diodes, commonly referred to as laser diode bars, which are electrically connected together and aligned so that the light path of each of the individual semiconductor laser diode bars is parallel. The laser diode bars are mounted to a thermally conductive substrate, such as a beryllium oxide BeO substrate. The substrate is used to conduct waste heat from the individual laser diode bars. The substrate, in turn, may be mounted to a microchannel, pin-fin, or labrynth type cooler for further cooling. Examples of such semiconductor diode laser arrays are disclosed in U.S. Pat. Nos. 5,040,187; 5,099,488; 5,305, 304; 5,394,426; 5,438,580 and 5,835,518. Such semiconductor laser diode arrays are also disclosed in commonly-owned U.S. Pat. Nos. 5,748,654 and 6,208,677, hereby incorporated by reference.

Such laser diode bars are normally formed in a rectangular bar shape from various semiconductor materials such as GaAs, AlGa, As and InP semiconductor materials. Electrodes are normally formed on opposing longitudinal edges to allow such laser diode bars to be connected to an external source of electrical power. When such semiconductor laser diodes are configured in an array, the individual laser diode bars are connected in series. One electrode on each end of the array is connected to an external source of electrical power.

Various techniques are known for interconnecting the individual laser diode bars. For example, U.S. Pat. No. 5,040,187 discloses a substrate with a plurality of spaced apart parallel rectangular grooves. A continuous metallization pattern is formed from one end of the substrate to the other as well as in the walls of the grooves. The width of the grooves is selected to be slightly smaller than the width of the individual laser bars. The substrate is flexed to spread out the grooves apart to enable the laser diode bars to be inserted therein. When the substrate returns to a normal position, the laser diode bars are firmly compressed within the grooves to provide a secure electrical connection between the electrodes on the laser diode bars and the metallization laser on the substrate. Unfortunately, when packaged such an arrangement may cause tensile stress on the laser diode bars which can cause damage.

In order to avoid tensile stress on the laser diode bars, alternate methods for electrically interconnecting the laser diode bars have been developed. An example of such an interconnection method is illustrated in U.S. Pat. No. 5,305, 344. In particular, the '344 patent discloses a substrate with a plurality of spaced apart generally parallel grooves. A soft solder layer is disposed in each of the grooves. The laser diode bars are disposed in the grooves. Electrical connection between the laser diode bars is by reflow of the solder layer within the grooves. Unfortunately, the interconnection method disclosed in the '344 patent results in various known failure modes, such as degradation of the laser diode bar, solder creep onto bar and contamination of the laser diode bars. Other known failure modes include alloying, melting, vaporization and arcing which can lead to a catastrophic destruction of the laser diode bars forming the array. Thus, there is a need for a semiconductor laser diode array that is fabricated in such a manner to eliminate known failure modes associated with fluxed soft soldering interconnection methods while at the same time minimizing stress caused by packaging to prevent damage to the laser diode arrays during assembly.

SUMMARY OF THE INVENTION

The present invention relates to a semiconductor laser diode array which includes a plurality of laser diode bars. Each of the laser diode bars is carried by a submount forming a subassembly. Each subassembly is separated by a flexible, compliant, or expansion-matched electrically conductive spacer. All connections within the array are by way of a non-fluxed solder, hard and/or soft, reflowed in a non-oxidizing atmosphere in a simple mechanical stack fixture to create nearly void-free solder joints with relatively high thermal integrity and electrical conductivity. Flexible, compliant or expansion-matched electrically conductive spacers are disposed between the subassemblies to substantially eliminate the stress on the laser diode bars while providing electrical conductivity between subassemblies. The subassemblies are carried by a thermally conductive dielectric substrate, such as a beryllium oxide, BeO, substrate, which, in turn, allows waste heat generated from the laser diode bars to be conducted to a cooling device, such a backplane cooler. In addition to eliminating known failure modes of semiconductor laser diode arrays in the solder interconnection as well as minimizing a stress on the diode arrays, the semiconductor laser diode array in accordance with the present invention is relatively simple and thus relatively inexpensive to fabricate and results in a more reliable semiconductor laser diode array with a useful life relatively longer than known devices.

DESCRIPTION OF THE DRAWINGS

These and other advantages of the present invention will be readily understood with reference to the following specification and attached drawings wherein:

FIGS. 10A–10C represent an alternate embodiment of the semiconductor laser diode array in accordance with the present invention.

DETAILED DESCRIPTION

The present invention relates to a semiconductor laser diode array which utilizes non-fluxed solder, hard and/or soft, such as eutectic solder, to form relatively void-free solder joints between various components of the semiconductor laser diode array with relatively high thermal integrity and electrical conductivity. The term "hard solders" is well known and is generally understood to include solders that are harder than soft solders, such as 80 Au/20 Sn, m.p. 278° C., or 88 Qu/12 Ge, m.p. 361° C. The term "soft solders" is also a well known term and is generally understood to include solders with lower melting points and comprised of Pb, Sn and Ag, such as Sn 96: 4% Ag, balance Sn, m.p. 221° C. or Sn 63: 63% Sn, 36% Pb, m.p. 183° C. As such, the use of non-fluxed hard and/or soft solder joints virtually eliminates many known failure modes associated with semiconductor laser diode arrays in which interconnection between components are made by way of fluxed soft solder. In order to minimize tensile stress between the various laser diode bars forming the array, electrically conductive flexible, compliant, or expansion-matched spacers are used. As will be discussed in more detail below, another important aspect of the invention is its relative simplicity which enables the semiconductor laser diode arrays to be fabricated relatively inexpensively from commonly available or easily manufactured components.

Figure 1:
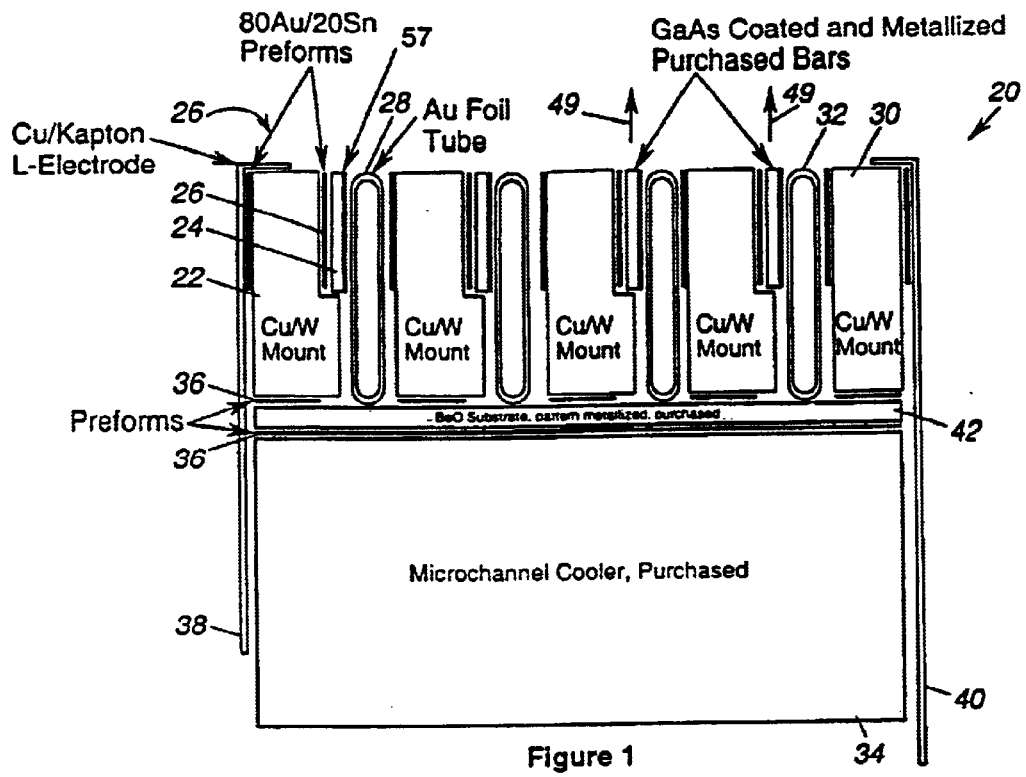
FIG. 1 is a cross-sectional view of a semiconductor laser diode array in accordance with the present invention.

Turning to the drawings and in particular to FIG. 1, a first embodiment of a semiconductor laser diode array in accordance with the present invention is illustrated. The semiconductor laser diode array, generally identified with the reference numeral 20, includes a plurality of submounts 22, formed from an electrically conductive and thermally conductive material. As shown, the semiconductor laser diode array 20 includes four laser diode bars, generally identified with the reference numeral 24. As shown in FIG. 1, each of the laser diode bars 24 is carried and electrically connected along one surface to a submount 22 forming a subassembly. In order to reduce stress between the subassemblies, flexible, compliant, or expansion-matched spacers 28 are disposed between each of the subassemblies. The spacers 28 are flexible, compliant or expansion-matched and formed from an electrically conductive material. As shown, the spacer 28 is shown as a foil tube formed from a soft ductile material that is preferably non-oxidizing in air, such as gold, Au, or other precious metals. An additional submount 30 as well as an additional spacer 32 may be provided on the end of the array 20 so that the length of the array matches the length of commercially available backplane coolers.

Figure 3A:
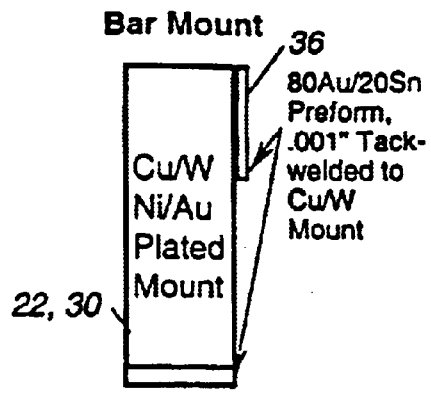
FIGS. 3A–3C illustrate intermediate processing steps illustrating the use of solder preforms, hard and/or soft, attached to the Cu/W mount, flexible compliant or expansion matched spacer and copper electrode in accordance with one aspect of the invention.
Figure 3B:
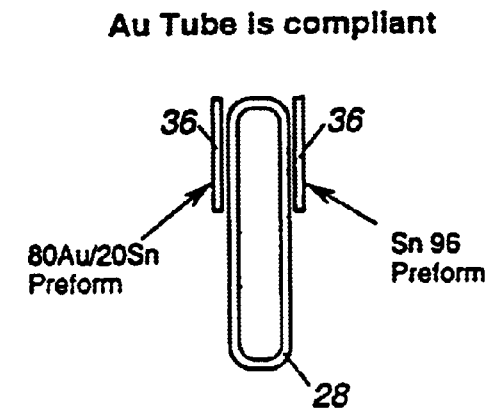
Figure 3C:
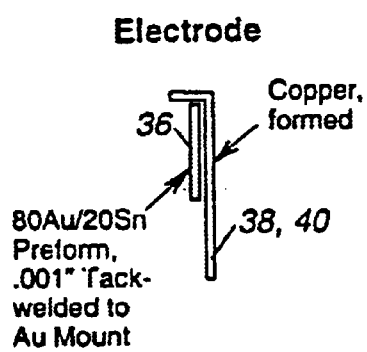

In accordance with an important aspect of the invention, electrical connection among the various components in the array 20 are by way of a non-fluxed solder, hard and/or soft, such as 80 Au/20 Sn or Sn 96 or other soft eutectic solders. The solder is formed as preforms, generally identified with the reference numerals 26, 36, and 57. Such solder preforms are commonly available, for example, from Coining Corporation of America in Saddle Brook, N.J. As best shown in FIGS. 3A–3C, the solder preforms may be initially rigidly attached to various components in the array 20. For example, FIG. 3A illustrates a solder preform rigidly attached to a submount 22 or 30, for example, by tack welding. The solder preforms 26, 36, and 57 may also be attached to opposing sides of the compliant spacer 28 as shown in FIG. 3B.

As shown in FIG. 1, the submounts 22, 30 on opposing ends of the array 20 are attached to electrodes 38, 40 for connection to an electrical circuit. The electrodes 38, 40 may be formed from Au-plated Cu covered with Kapton™ film and formed in generally L-shape. As shown in FIG. 3C, solder preforms may be rigidly attached each of the electrodes 38, 40.

In order to reduce the operating temperature of the array 20 generated by the laser diode bars 24, each of the subassemblies are rigidly secured to a thermally conductive dielectric substrate 42, for example, a beryllium oxide BeO substrate. Such BeO substrates are known to have a thermal conductivity of 200 watts/meter/° K. Other substrate materials are also suitable, such as silicon carbide which has a thermal conductivity of 270/280 watts/meter/° K.

A metallized pattern (not shown) is formed on the substrate 42 by conventional photolithography techniques. The metallization patterns are used to provide a thermal conductivity path from the submounts 22, 30 to the backplane cooler 34. As such, metallization patterns are formed on both sides of the substrate 42. The solder preforms 36, hard and/or soft, are disposed adjacent each of the submounts 22, 30 to provide a secure thermal connection between the submounts 22, 30 and the backplane cooler 34. These hard and/or soft solder preforms 36 may either be rigidly attached to the substrate or alternatively to the submounts 22, 30 and/or the backplane cooler 34.

In order to optimize the electrical connection between the laser diode bars 24 and the compliant spacers 28, pure gold, Au, is selected for the compliant spacer 28. Pure gold is soft and ductile and does not oxidize in air which eliminates the need for flux and optimizes the electrical contact. The use of the nonfluxed solder, hard and/or soft, preforms eliminates the contamination from solder flux so that the solder preforms can be reflowed in a non-oxidizing environment, such as a nitrogen environment. In general, oxidizing materials other than gold, Au, require flux which can lead to corrosion and voids and alloying. The diode array 20 in accordance with the present invention may be heated in a nitrogen environment to cause reflow of the solder, 80 Au/20 Sn, for example, after vacuum degassing in a known manner. Various devices are available for use in reflowing of the solder, such as a 5C Linear Hotplate machine, available from SIKAMA Corporation in Santa Barbara, Calif., which includes a plurality of microprocessor-controlled hotplates in an inert or 10% $H_2$ reducing environment. The use of such a machine along with the solder preforms allow relatively precise control of the solder volume by way of microprocessor control of the temperature profiles. The use of such machines in the manner of controlling solder reflow is well known in the art.

Figure 2:
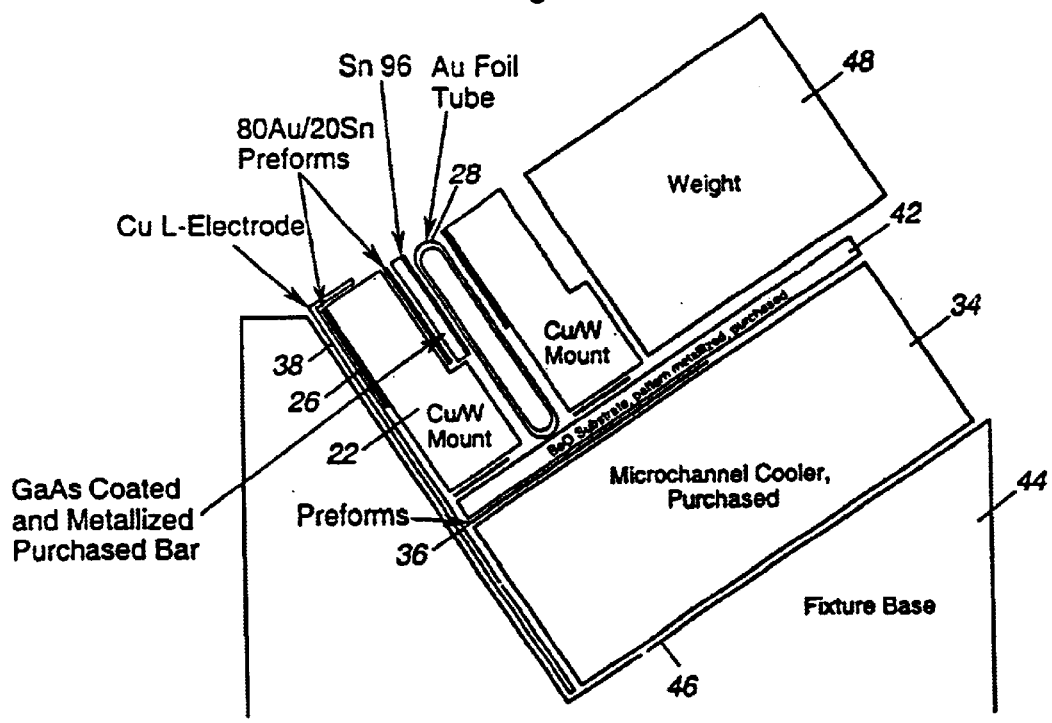
FIG. 2 is a block diagram of a semiconductor laser diode array in accordance with the present invention at an intermediate fabrication step, shown in a fixture base.

The configuration of the array 20 allows for a simple mechanical stack arrangement to be used for assembly as shown in FIG. 2. An exemplary fixture 44 for fabricating the array 20 is illustrated in FIG. 2. As shown, the fixture includes a generally L-shaped notch 46. Initially, the solder preforms are rigidly secured to the various components of the array 20 in a manner as discussed above. The various subassemblies are essentially stacked in place as shown in FIG. 2. A weight 48 may be used to squeeze the various subassemblies together. After the array is formed in the fixture 44, the array may be degassed and heated in the manner as discussed above to form a semiconductor laser diode array in accordance with the present invention.

Figure 4:
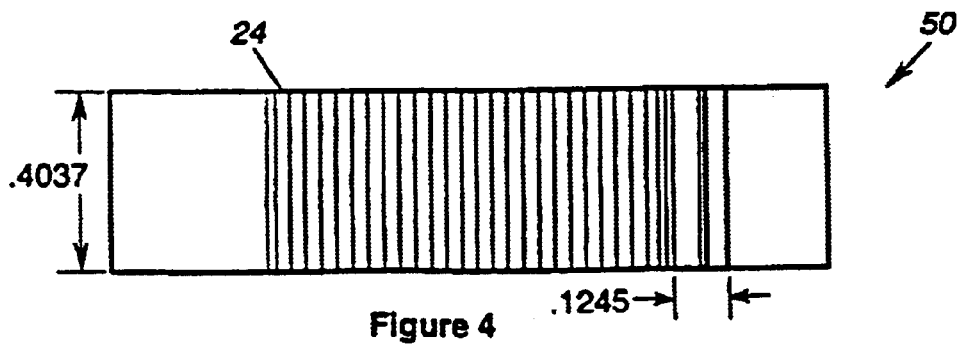
FIG. 4 is a plan view of the laser diode bar array in accordance with the present invention.
Figure 5:
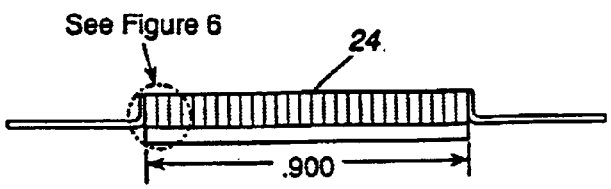
FIG. 5 is a side elevational view of the semiconductor laser diode array illustrated in FIG. 4.
Figure 6:
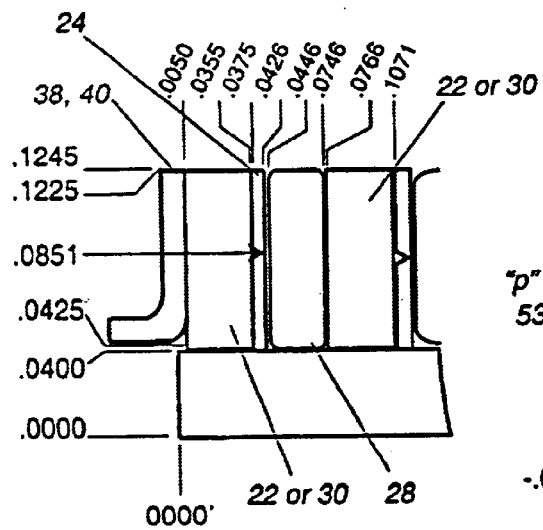
FIG. 6 is an enlarged partial side view of the semiconductor laser diode array illustrated in FIG. 4

The principles of the present invention may be used to form a semiconductor laser diode array having various numbers of laser diode bars 24. For example, FIG. 1 illustrates an embodiment which includes four laser diode bars 24 which emit light in a path or direction generally parallel with the arrow 49. However, the principles of the present invention are applicable to diode arrays having fewer or more laser diode bars 24. For example, FIGS. 4–6 illustrate an embodiment of a semiconductor laser diode array 50 having twelve laser diode bars 24.

Figure 7:
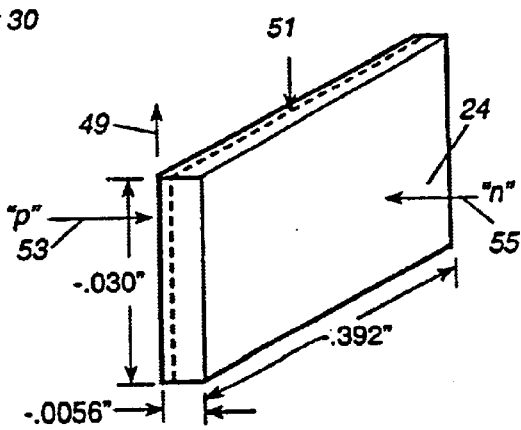
FIG. 7 is a perspective view of a laser diode bar for use with the present invention.

An exemplary laser diode bar 24 is illustrated in FIG. 7. Such laser diode bars are generally known in the art and are commercially available, for example, from the Coherent Laser Group of Santa Clara, Calif. The laser diode bars have a thin internal epitaxial layer 51 shown as a dashed line in FIG. 7. The outer or near surface 53 of the layer 51 is known as the p surface of the bar. The epitaxial layer 51 is grown on semiconductor material which has an n surface 55 parallel to and opposed to the p surface 53. The dimension of the laser diode bar 24 is illustrated in FIG. 7. In accordance with the present invention, a hard solder preform 26 is disposed adjacent the p surface 53 and a soft solder preform 57 is disposed adjacent the n surface 55. Commercially laser diode bars 24 are preferably provided with a gold-plated interface for connection to the compliant spacers 28. Various diode bars having various characteristics are suitable for use with the present invention. Exemplary characteristics for the laser diode bar 24 are as follows: wavelength 808 nanometers±3 nanometers; 20% duty cycle; 250: SEC; 70 watts power; 90% fill factor; 1,000 micron cavity depth; 1 centimeter length and 135 micron wafer thickness, cleaved out of a GaAs wafer.

The submounts 22, as mentioned above, are formed from an electrically and thermally conductive materials. For example, copper tungsten CuW submounts, for example 0.625 inches×0.08 inches×0.3937 inches, available from Ametek Corporation in Wallingford Conn. are suitable. These submounts are formed from a 10% composition of copper Cu and a 90% composition of tungsten W. Alternatively, the submounts 22 may be formed from copper molybdenum (15% Cu/85% Mo.).

As shown in FIG. 1, the submount 22 may be formed with a step to make assembly easier. As mentioned above, submounts, such as the submount 30 (FIG. 1) used on the end of the array are formed in a generally rectangular shape. In addition, as will be discussed in more detail below rectangular submounts can also be used in embodiments, such as the alternate embodiment illustrated in FIGS. 10 and 11, which are discussed in detail below.

The preforms 26, 36, and 57 are formed as metallic foils of solder, hard and/or soft, material, such 80 Au/20 Sn, or Sn 96 available from Coining Corporation of America in Saddle Brook, N.J. Other hard or soft solder or so-called eutectic materials are also suitable for use with the present invention.

Figure 8:
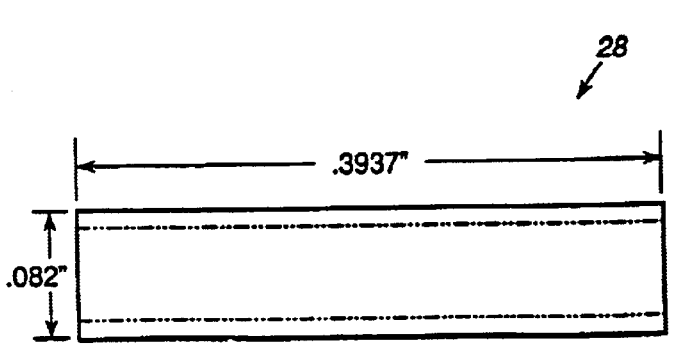
FIG. 8 is a front view of an exemplary flexible spacer for use with the present invention.
Figure 9:
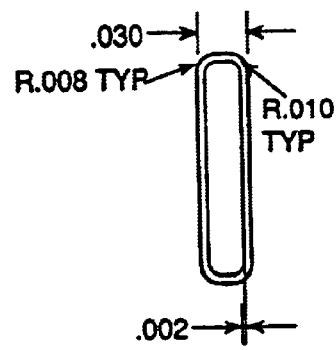
FIG. 9 is a side view of the spacer illustrated in FIG. 8.
Figure 12:
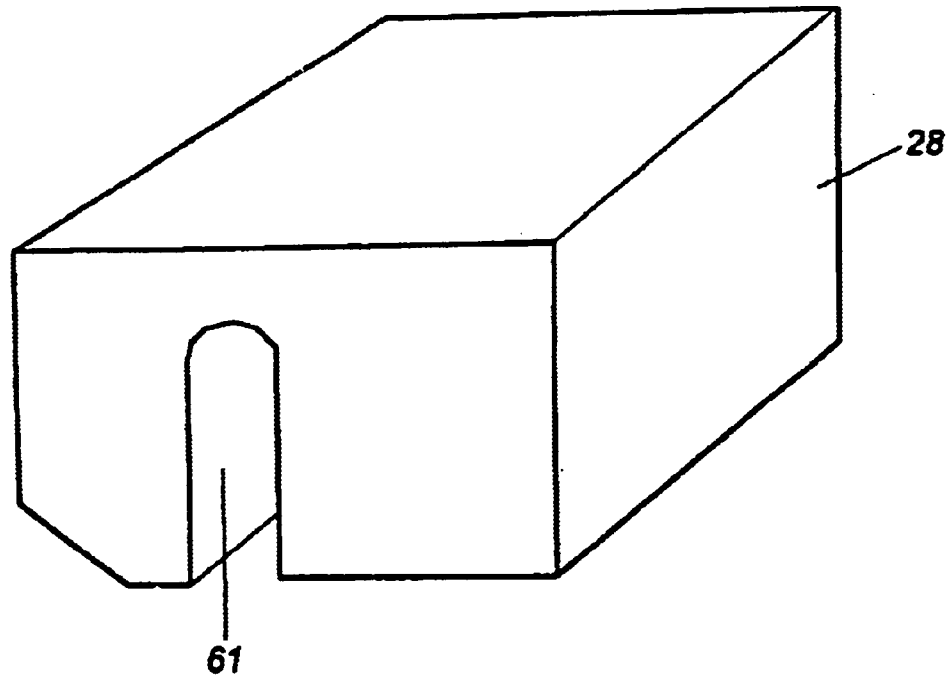
FIG. 12 is another embodiment of the spacer having a U-shape.
Figure 13:
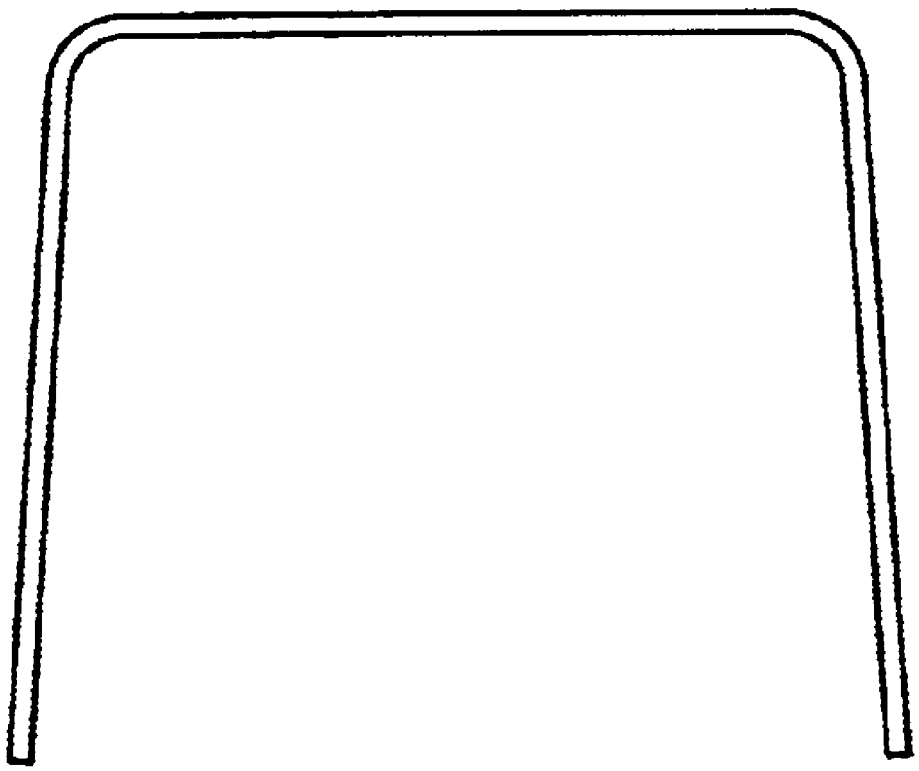
FIG. 13 is an alternate embodiment of the U-shape spacer illustrated in FIG. 12.

Various embodiments of the flexible, compliant, or expansion-matched spacer are contemplated. For example, as shown in FIGS. 1, 8 and 9, a hollow tube of a non-oxidizing material, such as gold, Au, may be used. As mentioned above, the compliant spacer 28 is formed from pure gold which is soft ductile material and does not oxidize in air. The hollow shape allows the compliant spacer 28 to decouple stress from the laser diode bars 24. Alternatively, the compliant spacer can be made in other shapes such as a U-shape. The use of a U-shape requires two bends in a foil material instead of forming a tube, or machining a slot 61 in the spacer 28, as shown in FIG. 12.

For example, the compliant spacer can be electro-formed in copper or gold on an aluminum mandrel. After the copper is electro-formed, the Al mandrel can be etched away and the copper gold plated, or pure gold can be electro-formed.

Figure 11:
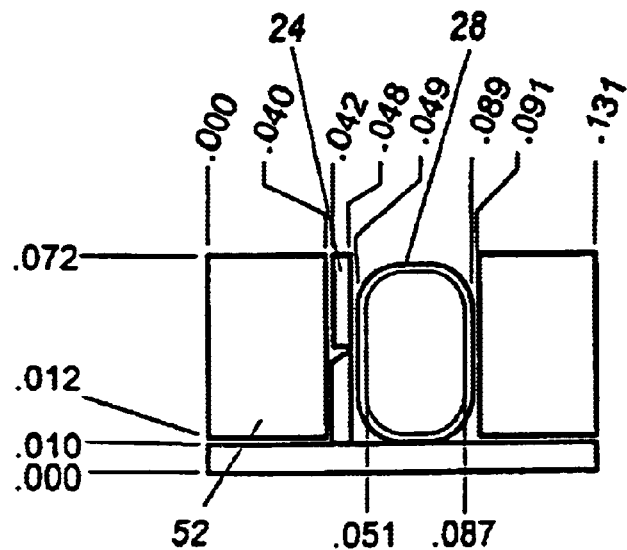
FIG. 11 is detailed elevational view of the alternate embodiment illustrated in FIG. 10.

FIGS. 10 and 11 illustrate an alternate embodiment of the invention and identified generally with the reference numeral 51. In this embodiment, like components are identified with the same reference numeral as the first embodiment illustrated in FIG. 1. The major difference in this embodiment is the use of rectangular submounts 52. In this embodiment, an alumina spacer 54 having essentially the same width as the laser diode bar 24 is disposed on the backside of the laser diode bar 24 to the assembly. The alumina spacer 54 may be provided with an angled end surface as shown to provide an air space 56 below the laser diode bar 24. Alternatively, an alumina spacer bar may simply be cut with a notch for the laser diode bar 24 (not shown).

In this embodiment, solder, hard and/or soft, preforms are used to connect the various components together as in the embodiment as illustrated in FIG. 1. However, in the embodiment illustrated in FIGS. 10 and 11 the length of the preform disposed adjacent to the laser diode bar 24 and alumina spacer 54 is selected to be equal to the length of the submount 52 since both the alumina spacer 54 and laser diode bar 24 must be connected.

Obviously, many modification and variations of the present invention are possible in light of the above teachings. For example, thus, it is to be understood that, within the scope of the appended claims, the invention may be practiced otherwise than as specifically described above.

We claim:

1. A semiconductor laser diode array comprising:

a plurality of laser diode bars aligned in an array so that light paths are generally parallel;

a plurality of electrically conductive submounts, disposed between said laser diode bars;

a pair of opposing electrodes connected to two of said plurality of laser diode bars;

a plurality of flexible electrically conductive spacers disposed between said laser diode bars and said submounts, said spacers formed from a compliant material having a hollow cross-section to relieve stress on said laser diode bars;

a thermally conductive substrate for carrying said plurality of laser diode bars, said plurality of electrically conductive submounts, and said electrodes, and receiving heat generated by said laser diode bars; and a plurality of non-fluxed solder preforms disposed adjacent said laser diode bars; and said thermally conductive substrate for providing a continuous path therebetween when heated to a point to cause reflow.

2. The semiconductor laser diode array as recited in claim 1, wherein said flexible electrically conductive spacers are formed as a hollow tube.

3. The semiconductor laser diode array as recited in claim 2, wherein said flexible electrically conductive spacers are formed in a generally rectangular shape.

4. The semiconductor laser diode array as recited in claim 1, wherein said flexible, electrically conductive spacers with a generally U-shape cross-section.

5. The semiconductor laser diode array as recited in claim 1, wherein said flexible electrically conductive spacers are expansion-matched.

6. The semiconductor laser diode array as recited in claim 1, wherein one or more of said electrically conductive submounts may include a step.

7. The semiconductor laser diode array as recited in claim 1, wherein one or more of said electrically conductive submounts are formed in a generally rectangular shape.

8. The semiconductor laser diode array as recited in claim 1, wherein said submounts are formed from Cu/W.

9. The semiconductor laser diode array as recited in claim 1, wherein said submounts are formed from Cu/Mo.

10. The semiconductor laser diode array as recited in claim 1, wherein said flexible electrically conductive spacers are formed from a non-oxidizing material.

11. The semiconductor laser diode array as recited in claim 10, wherein said non-oxidizing material is gold.

12. The semiconductor laser diode array as recited in claim 1, wherein at least one of said non-fluxed solder preforms are formed from a hard solder material.

13. The semiconductor laser diode array as recited in claim 12, wherein said hard solder preform is formed from 80 Au/20Sn.

14. The semiconductor laser diode array as recited in claim 1, wherein at least one of said non-fluxed solder preforms are formed from a soft solder material.

15. The semiconductor laser diode array as recited in claim 14, wherein said soft solder preform is formed from Sn 96 material.

16. The semiconductor laser diode array as recited in claim 13, wherein said soft solder preform is formed from Sn 63 material.

17. The semiconductor laser diode array as recited in claim 1, wherein said substrate is formed from a material having a thermal conductivity of about 200 watts/meter/° K or higher.

18. The semiconductor laser diode array as recited in claim 1, further including a cooler disposed adjacent said substrate.

19. A semiconductor laser diode array comprising:

a plurality of laser diode bars aligned in an array so that light paths are generally parallel;

a plurality of electrically conductive submounts disposed between said laser diode bars;

a pair of opposing electrodes connected to two of said plurality of laser diode bars;

a thermally conductive substrate for carrying said plurality of laser diode bars, said plurality of electrically conductive submounts said electrodes, and receiving heat generated by said laser diode bars; and a plurality of non-fluxed solder preforms disposed adjacent said laser diode bars, and said thermally conductive substrate for providing a continuous path therebetween when heated to a point to cause reflow, wherein each of said laser diode bars has opposed p and n surfaces in the plane of a light path and wherein at least one of the non-fluxed solder preforms is comprised of a hard solder adjacent said p surface and wherein at least one of said non-fluxed solder preforms comprises a soft solder adjacent said n surface.

* * * * *

UNITED STATES PATENT AND TRADEMARK OFFICE
CERTIFICATE OF CORRECTION

PATENT NO. : 6,700,913 B2
DATED : March 2, 2004
INVENTOR(S) : George G. Pinneo et al.

It is certified that error appears in the above-identified patent and that said Letters Patent is hereby corrected as shown below:

Column 5,
Line 9, claim 4 should read as follows:
-- The semiconductor laser diode array as recited in claim 1, wherein said flexible, electrically conductive spacer are formed with a generally U-shape cross section. --.
Line 18, claim 7 should read as follows:
-- The semiconductor laser diode array as recited in claim 1, wherein one or more of said electrically conductive submounts are formed in a rectangular shape. --

Signed and Sealed this

Third Day of August, 2004

JON W. DUDAS
*Acting Director of the United States Patent and Trademark Office*